United States Patent
Koga et al.

(10) Patent No.: US 10,452,808 B2
(45) Date of Patent: Oct. 22, 2019

(54) NON-TRANSITORY COMPUTER-READABLE STORAGE MEDIUM, ANTENNA DESIGN DEVICE, AND ANTENNA DESIGN METHOD

(71) Applicant: FUJITSU LIMITED, Kawasaki-shi, Kanagawa (JP)

(72) Inventors: Yohei Koga, Kawasaki (JP); Manabu Kai, Yokohama (JP); Takashi Yamagajo, Yokosuka (JP); Yasumitsu Ban, Yokohama (JP); Hiroyuki Egawa, Fukuoka (JP); Kan Fujieda, Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 246 days.

(21) Appl. No.: 15/427,893

(22) Filed: Feb. 8, 2017

(65) Prior Publication Data

US 2017/0235869 A1 Aug. 17, 2017

(30) Foreign Application Priority Data

Feb. 12, 2016 (JP) .................. 2016-024680

(51) Int. Cl.
*H01Q 9/04* (2006.01)
*H01Q 9/42* (2006.01)
(Continued)

(52) U.S. Cl.
CPC .......... *G06F 17/5086* (2013.01); *H01Q 1/00* (2013.01); *H01Q 9/0407* (2013.01); *H01Q 9/42* (2013.01); *H01Q 13/02* (2013.01); *H04L 67/12* (2013.01)

(58) Field of Classification Search
CPC .......... H01Q 1/00; H01Q 9/0407; H01Q 9/42; H01Q 13/02; G06F 17/5086
(Continued)

(56) References Cited

U.S. PATENT DOCUMENTS

| 2009/0164954 A1* | 6/2009 | Yamagajo | H01Q 1/2208 716/132 |
| 2012/0065945 A1* | 3/2012 | Brown | H01Q 1/00 703/1 |

(Continued)

FOREIGN PATENT DOCUMENTS

| JP | 2003-332814 A | 11/2003 |
| JP | 2006-238234 A | 9/2006 |

(Continued)

OTHER PUBLICATIONS

Gaetano Marrocco, "The Art of UHF RFID Antenna Design: Impedance-Matching and Size-Reduction Techniques", IEEE Antennas and Propagation Magazine, vol. 50, No. 1, pp. 66-79, Feb. 2008.

(Continued)

*Primary Examiner* — Brian S Cook
*Assistant Examiner* — Faraj Ayoub
(74) *Attorney, Agent, or Firm* — Arent Fox LLP

(57) ABSTRACT

A non-transitory computer-readable storage medium storing an antenna design program that causes a computer to execute a process, the process including acquiring a target characteristic value of a target antenna when a value of a structure parameter is a predetermined value, based on the predetermined value of the structure parameter, the target characteristic value, and a relation, with respect to a reference antenna, between a value of a structure parameter and a characteristic value, estimating the relation with respect to the target antenna, the reference antenna having a same shape feature as the target antenna, an antenna type of the reference antenna being different from the target antenna, determining a value of the structure parameter for the target antenna such that the characteristic value of the target antenna satisfies a demanded specification based on the (Continued)

estimated relation, and outputting the determined value of the structure parameter.

7 Claims, 12 Drawing Sheets

(51) Int. Cl.
*H01Q 13/02* (2006.01)
*H01Q 1/00* (2006.01)
*H04L 29/08* (2006.01)
*G06F 17/50* (2006.01)

(58) Field of Classification Search
USPC .............................................................. 703/1
See application file for complete search history.

(56) References Cited

U.S. PATENT DOCUMENTS

| | | |
|---|---|---|
| 2013/0173234 A1 | 7/2013 | Yamagajo et al. |
| 2014/0074440 A1* | 3/2014 | Yamagajo ............... G06F 17/50 703/1 |

FOREIGN PATENT DOCUMENTS

| | | |
|---|---|---|
| JP | 2009-163933 A | 7/2013 |
| JP | 2013-141081 A | 7/2013 |

OTHER PUBLICATIONS

Extended European Search Report for corresponding foreign application No. 17155214.4 dated Jul. 18, 2017.

* cited by examiner

| Height | Band | GND | Gain | TYPE OF TARGET ANTENNA |
|---|---|---|---|---|
| 0 | 0 | 0 | 0 | DIPOLE ANTENNA |
| 0 | 0 | 0 | 1 | YAGI-UDA ANTENNA |
| 0 | 0 | 1 | 0 | REVERSED L ANTENNA |
| 0 | 0 | 1 | 1 | PATCH ANTENNA |
| 0 | 1 | 0 | 0 | BOW TIE ANTENNA |
| 0 | 1 | 0 | 1 | HORN ANTENNA |
| 0 | 1 | 1 | 0 | PLANAR MONOPOLE ANTENNA |
| 0 | 1 | 1 | 1 | SPECIFICATION REVIEW |
| 1 | 0 | 0 | 0 | SPIRAL DIPOLE ANTENNA |
| 1 | 0 | 0 | 1 | BENDING DIPOLE ANTENNA |
| 1 | 0 | 1 | 0 | REVERSED F ANTENNA |
| 1 | 0 | 1 | 1 | PATCH ANTENNA |
| 1 | 1 | 0 | 0 | DIPOLE ANTENNA WITH MATCHING CIRCUIT |
| 1 | 1 | 0 | 1 | RHOMBIC ANTENNA |
| 1 | 1 | 1 | 0 | MONOPOLE ANTENNA WITH MATCHING CIRCUIT |
| 1 | 1 | 1 | 1 | SPECIFICATION REVIEW |

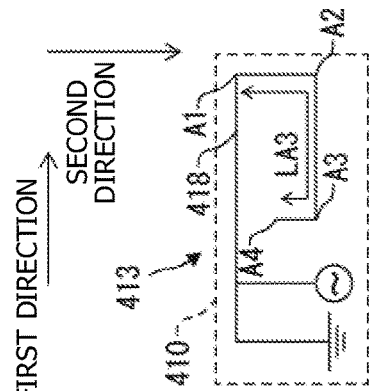
FIG. 4A
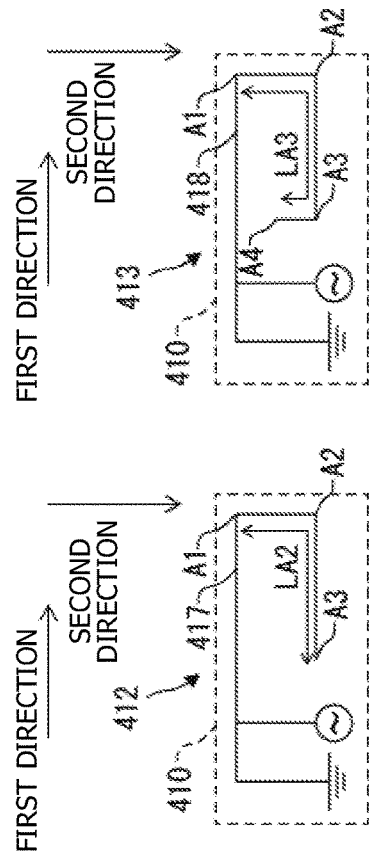
FIG. 4B
FIG. 4C
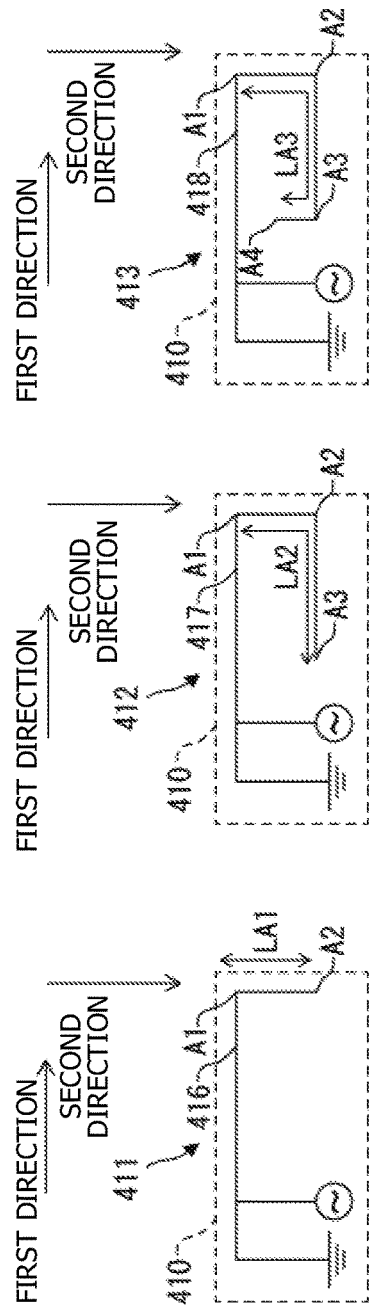
FIG. 4D
FIG. 4E
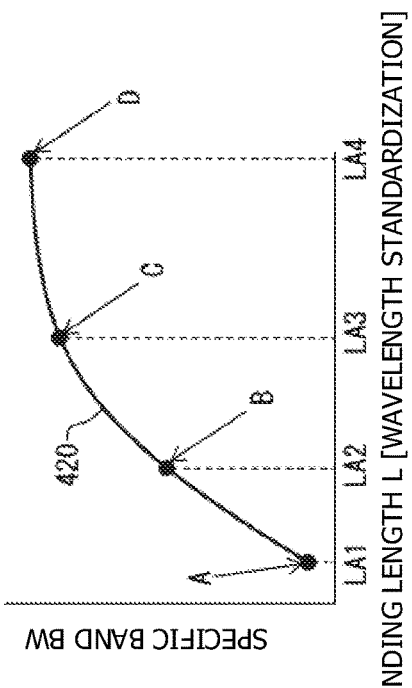
FIG. 4F

FIG. 7A
| BENDING LENGTH L | EXTENDING DIRECTION OF RADIATING ELECTRODE |
|---|---|
| 0<L≦LA1 | FIRST DIRECTION |
| LA1<L≦LA2 | SECOND DIRECTION |
| LA2<L≦LA3 | DIRECTION OPPOSITE TO FIRST DIRECTION |
| LA3<L≦LA4 | DIRECTION OPPOSITE TO SECOND DIRECTION |
| LA4<L | FIRST DIRECTION |
↖ 700
FIG. 7B
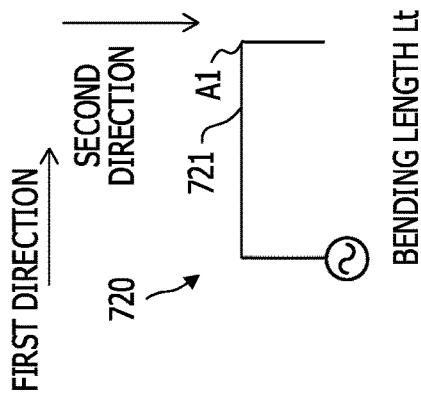
FIG. 7C
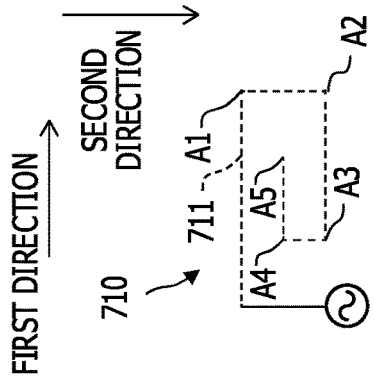

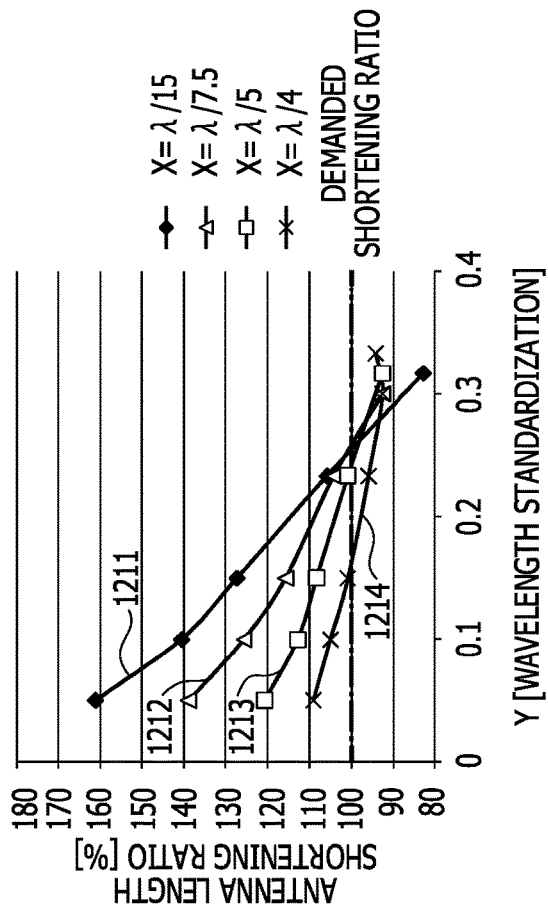
FIG. 12B
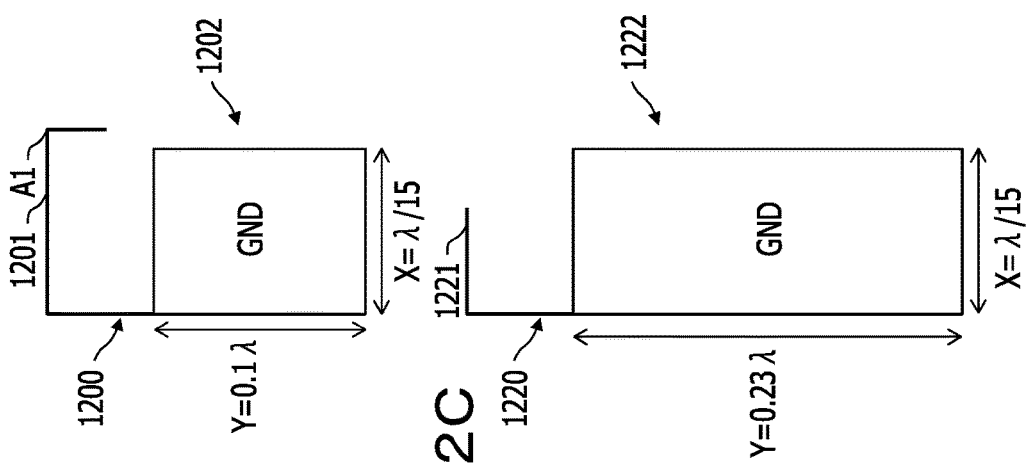
FIG. 12A
FIG. 12C

NON-TRANSITORY COMPUTER-READABLE STORAGE MEDIUM, ANTENNA DESIGN DEVICE, AND ANTENNA DESIGN METHOD

CROSS-REFERENCE TO RELATED APPLICATION

This application is based upon and claims the benefit of priority of the prior Japanese Patent Application No. 2016-024680, filed on Feb. 12, 2016, the entire contents of which are incorporated herein by reference.

FIELD

The embodiment discussed herein is related to a non-transitory computer-readable storage medium, an antenna design device, and an antenna design method.

BACKGROUND

Accompanied by development of Internet of Things (IOT), there may be increasing opportunities of designing an antenna. For this reason, an antenna designing device is demanded that enables designing even by a designer not having sufficient knowledge about antennas. An antenna designing device is known that reads out a model from a model memory unit based on an instruction from a designer, lets the designer make an input for changing the shape of the model using information of the length, and calculates a matching condition, a communication distance, and the like of an antenna for display (see Patent Literature 1, for example). With such an antenna designing device, a designer may acquire a matching condition, a communication distance, and the like of an antenna only by inputting information of the length of a part that is desired to be changed, whereby even a designer not having sufficient knowledge about antennas may efficiently design an antenna.

CITATION LIST

Patent Literature

[PATENT LITERATURE 1] Japanese Laid-open Patent Publication No. 2009-169933

SUMMARY

According to an aspect of the invention, a non-transitory computer-readable storage medium storing an antenna design program that causes a computer to execute a process, the process including acquiring a target characteristic value of a target antenna when a value of a structure parameter is a predetermined value, the structure parameter being a parameter that regulates a structure of antenna, based on the predetermined value of the structure parameter, the target characteristic value, and a relation, with respect to a reference antenna, between a value of a structure parameter and a characteristic value, estimating the relation with respect to the target antenna, the reference antenna having a same shape feature as the target antenna, an antenna type of the reference antenna being different from the target antenna, determining a value of the structure parameter for the target antenna such that the characteristic value of the target antenna satisfies a demanded specification based on the estimated relation, and outputting the determined value of the structure parameter.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 is a diagram illustrating an antenna type decision table.

FIG. 4A is a diagram illustrating an example of a reference antenna table, FIG. 4B is a diagram illustrating a first reference antenna used for creating the reference antenna table illustrated in FIG. 4A, FIG. 4C is a diagram illustrating a second reference antenna used for creating the reference antenna table illustrated in FIG. 4A, FIG. 4D is a diagram illustrating a third reference antenna used for creating the reference antenna table illustrated in FIG. 4A, FIG. 4E is a diagram illustrating a fourth reference antenna used for creating the reference antenna table illustrated in FIG. 4A, and FIG. 4F is a diagram illustrating relations between bending lengths and specific bands of antennas created from bending lengths and specific bands of the reference antennas illustrated in FIGS. 4B to 4E.

FIG. 7A is a diagram illustrating an example of the target antenna table, FIG. 7B is a diagram illustrating the target antenna shape decision processing using the target antenna table illustrated in FIG. 7A, and FIG. 7C is a diagram illustrating an example of a target antenna decided by the target antenna shape decision processing.

FIG. 12A is a diagram illustrating still another example of a target antenna, FIG. 12B is a diagram illustrating relations between shortening ratios of antenna lengths of reference antennas and sizes of ground electrodes of the reference antennas, and FIG. 12C is a diagram illustrating still another example of a target antenna decided by the target antenna shape decision processing.

DESCRIPTION OF EMBODIMENT

However, an antenna designing device as described above is capable of designing an antenna having a shape corresponding to a model stored in a model memory unit, but not applicable to designing an antenna having a shape different from the shape of the model stored in the model memory unit. In order to enable designing of antennas having various shapes, it is conceivable to increase the number of models stored in the model memory unit. However, the types of antennas and the shapes of radiating electrodes and ground electrodes of antennas are various. For this reason, it is not practical to prepare models indicating all antenna shapes.

An embodiment aims to provide an antenna designing computer program capable of deciding shapes of different types of antennas from the same information.

Hereinafter, with reference to the drawings, an antenna designing device will be explained. Based on the relation between a characteristic and the value of a structure parameter regulating the antenna structure at the time when the value is a predetermined value with respect to a reference antenna having the same shape feature as that of a target antenna, this antenna designing device estimates the relation between the value of the structure parameter and the characteristic with respect to the target antenna. This antenna designing device uses the estimated relation between the value of the structure parameter and the characteristic with respect to the target antenna to decide the value of the structure parameter, thereby being able to decide the shapes of different types of antennas from the same information.

Figure 1:
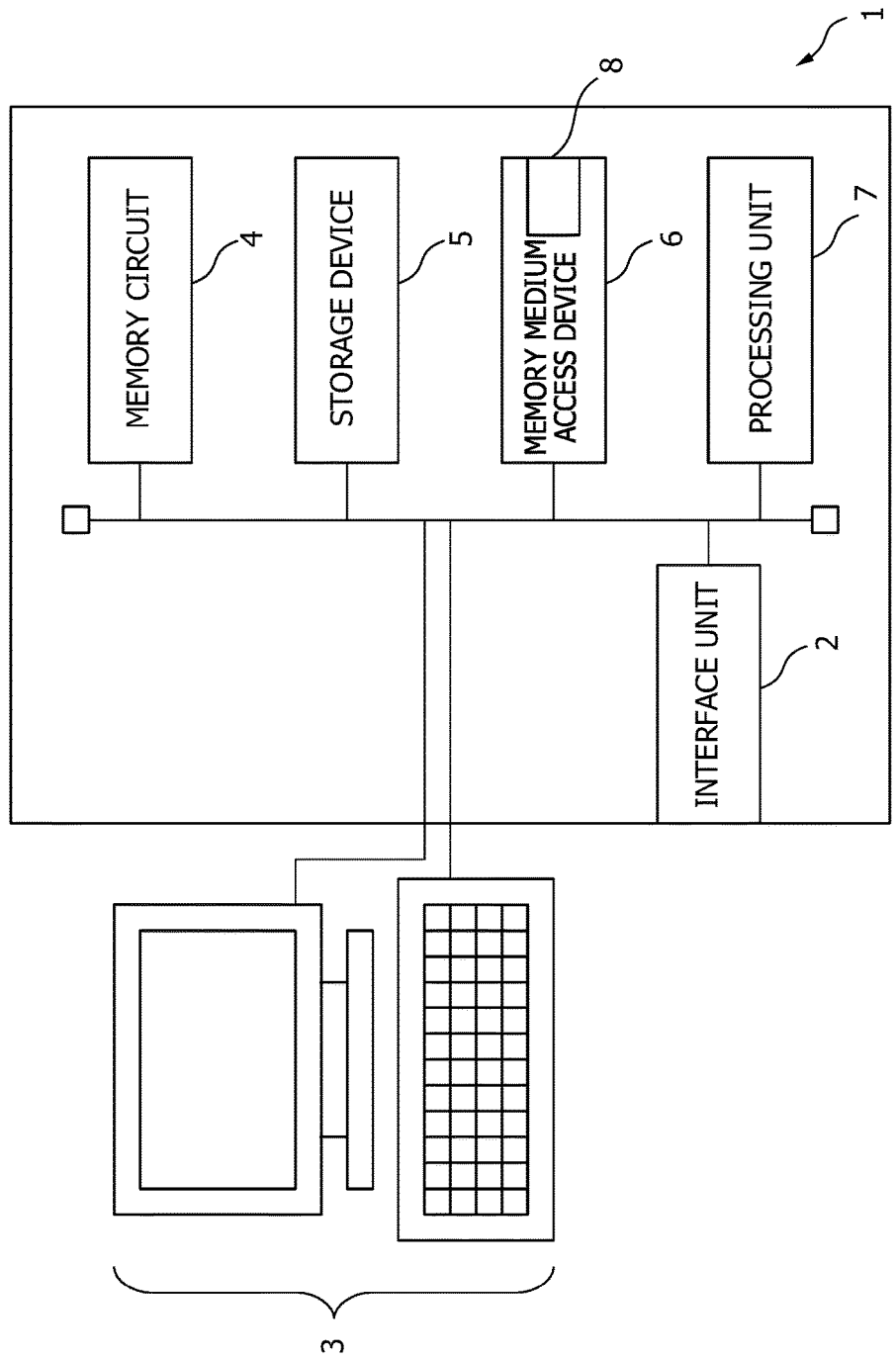
FIG. 1 is a schematic configuration diagram of an antenna designing device.

FIG. 1 is a schematic configuration diagram of an antenna designing device according to an embodiment. An antenna designing device 1 includes an interface unit 2, a user interface unit 3, a memory circuit 4, a storage device 5, a memory medium access device 6, and a processing unit 7. The processing unit 7 is connected to each of the other units of the antenna designing device 1 by a bus, for example.

The interface unit 2 is an interface for connecting the antenna designing device 1 to other devices (not illustrated) that generate or store information used for designing an antenna. For example, in order to receive information from other devices via a communication network in accordance with a communication standard such as Ethernet®, the interface unit 2 may include a communication interface for connecting to the communication network and a control circuit thereof.

The interface unit 2 receives the information from the other devices and forwards the information to the processing unit 7.

The user interface unit 3 includes an input device such as a keyboard and a mouse and a display device such as a liquid crystal display, for example. Alternatively, the user interface unit 3 may include a device formed by integrating an input device and a display device such as a touch panel display. Furthermore, the user interface unit 3 outputs an operation signal for starting designing of an antenna to the processing unit 7 in accordance with a user operation, for example.

Furthermore, the user interface unit 3 displays information indicating the details of the shape of the designed antenna, for example, which has been received from the processing unit 7.

The memory circuit 4 is an example of a memory unit and includes a semiconductor memory capable of reading and writing and a semiconductor memory dedicated for reading, for example. Furthermore, the memory circuit 4 stores therein a computer program for executing antenna designing processing executed on the processing unit 7, an intermediate calculation result obtained during the antenna designing processing, and the like. The computer program may be installed in the memory circuit 4, using a known setup program or the like, from a computer readable portable recording medium such as a semiconductor memory including a flash memory, for example.

The storage device 5 is an example of a memory unit and includes a magnetic disk and an access device thereof, for example. Furthermore, the storage device 5 stores therein various information used for designing of an antenna such as the characteristic value of the antenna, which has been received via the interface unit 2.

The memory medium access device 6 is a device that accesses a memory medium 8 such as a semiconductor memory card and an optical memory medium, for example. The memory medium access device 6 reads a computer program for antenna designing processing which is stored in the memory medium 8 and is executed on the processing unit 7 and forwards the read computer program to the processing unit 7, for example.

The processing unit 7 includes at least one processor and a peripheral circuit thereof and controls the entire antenna designing device 1. Furthermore, the processing unit 7 performs antenna designing processing. The processing unit 7 also forwards antenna designing information to the user interface unit 3, the storage device 5, and the memory medium access device 6.

Figure 2:
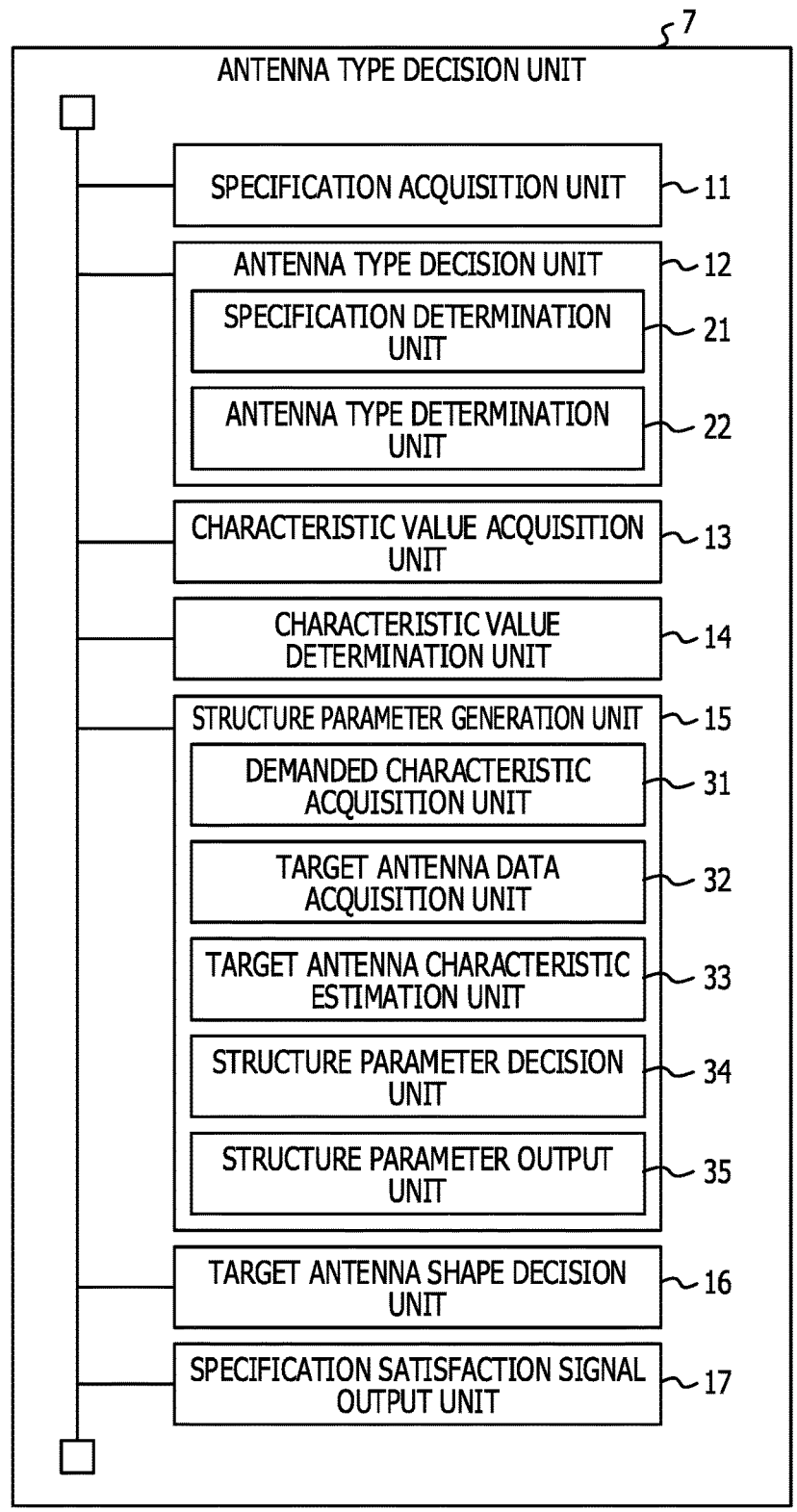
FIG. 2 is a functional block diagram of a processing unit illustrated in FIG. 1.

FIG. 2 is a functional block diagram of the processing unit 7 for performing antenna designing processing. The processing unit 7 includes a specification acquisition unit 11, an antenna type decision unit 12, a characteristic value acquisition unit 13, a characteristic value determination unit 14, a structure parameter generation unit 15, a target antenna shape decision unit 16, and a specification satisfaction signal output unit 17.

Each of these units included in the processing unit 7 is a functional module implemented by a computer program executed on a processor included in the processing unit 7, for example. Alternatively, each of these units included in the processing unit 7 may be mounted on the antenna designing device 1 separately from the processing unit 7 as one integrated circuit in which circuits implementing processing of each of the units are integrated.

The specification acquisition unit 11 acquires the specification of the demanded antenna. The antenna type decision unit 12 refers to an antenna type decision table indicating the relation between the acquired specification and the type of the antenna to decide the type of the target antenna. The characteristic value acquisition unit 13 acquires the characteristic value of the target antenna. The characteristic value determination unit 14 determines whether the acquired characteristic value of the target antenna satisfies the demanded specification. When it is determined that the characteristic of the target antenna does not satisfy the demanded specification, the structure parameter generation unit 15 changes the value of the structure parameter regulating the structure of the target antenna such that the demanded specification is satisfied. When changing the value of the structure parameter, the structure parameter generation unit 15 estimates the relation between the value of the structure parameter and the characteristic with respect to the target antenna, based on the relation between the value of the structure parameter and the characteristic of a reference antenna having the same shape as and a different type from the target antenna. The structure parameter generation unit 15 uses the estimated relation between the value of the structure parameter and the characteristic with respect to the target antenna to decide the value of the structure parameter.

The specification acquisition unit 11 acquires the specification demanded for the antenna to be designed. The specification that the specification acquisition unit 11 acquires includes the gain of the antenna, the specific band of the antenna, the height of the antenna, presence or absence of a ground electrode and the size thereof, and presence or absence of a dielectric and a magnetic body of a substrate or the like arranged in proximity to the antenna and the sizes thereof, for example. The specification acquisition unit 11 causes a display device of the user interface unit 3 to display a screen on which a designer may input the specification demanded for the antenna to be designed. The specification acquisition unit 11 acquires the specification input via an input device of the user interface unit 3.

The antenna type decision unit 12 refers to the antenna type decision table stored in the storage device 5, decides the type of the target antenna from the specification acquired by the specification acquisition unit 11, and outputs the decided type of the target antenna. The antenna type decision unit 12 includes a specification determination unit 21 and an antenna type determination unit 22. The specification determination unit 21 generates determination result information indicating a determination result from determination of each item of the specification demanded for the antenna to be designed. The antenna type determination unit 22 refers to the antenna type decision table to decide the type of the target antenna from the determination result information generated by the specification determination unit 21.

FIG. 3 is a diagram illustrating an example of an antenna type decision table.

An antenna type decision table 300 indicates relations between values of determination result information flags "Gain", "GND", "Band", and "Height" and the shape of the antenna. The flag "Gain" indicates whether the gain included in the specification is equal to or higher than 5 dB. The flag "GND" indicates whether the information indicating that a ground electrode has to be used is included in the specification. Furthermore, the flag "Band" indicates whether the specific band included in the specification is equal to or higher than 24.5%. The flag "Height" indicates whether the height of the antenna included in the specification is equal to or higher than $\lambda/30$. The antenna type determination unit 22 refers to the antenna type decision table 300 to decide the type of the antenna. The antenna type decision table 300 is stored in the storage device 5 in advance before the antenna designing processing performed by the antenna designing device 1 is performed.

When "Gain" of the determination result information generated by the specification determination unit 21 is 0, "GND" is 1, "Band" is 0, and "Height" is 0, the antenna type determination unit 22 decides the type of the antenna to a reversed L antenna. Furthermore, when "Gain" of the determination result information generated by the specification determination unit 21 is 0, the "GND" is 1, "Band" is 0, and "Height" is 1, the antenna type determination unit 22 decides the type of the antenna to a reversed F antenna. Furthermore, when "Gain" of the determination result information generated by the specification determination unit 21 is 1, "GND" is 1, "Band" is 1, and "Height" is 0, the antenna type determination unit 22 decides to review the specification of the antenna. In this case, the antenna type determination unit 22 causes the display device of the user interface unit 3 to perform display indicating review of the specification and the designer inputs again the specification via the input device of the user interface unit 3.

The characteristic value acquisition unit 13 acquires a target characteristic value being the characteristic value of the target antenna. The characteristic value acquisition unit 13 causes the display device of the user interface unit 3 to display a screen capable of receiving an input of the characteristic value of the target antenna decided by the antenna type decision unit 12. The characteristic value of the target antenna includes a specific band of the target antenna, a S parameter (scattering parameter), a gain, a radiation efficiency, and the like. The characteristic value of the target antenna is stored in the memory circuit 4. The designer acquires characteristic value of the target antenna by electromagnetic field simulation such as a finite element method with respect to the shape of the target antenna, actual measurement, or the like and inputs the acquired characteristic value to the input device of the user interface unit 3. The characteristic value acquisition unit 13 acquires the characteristic value input via the input device of the user interface unit 3 as the target characteristic value. The characteristic value acquisition unit 13 may acquire the shape of the target antenna decided by the antenna type decision unit 12 and performs electromagnetic field simulation such as a finite element method with respect to the shape of the acquired target antenna, thereby acquiring the target characteristic value. By performing electromagnetic filed simulation such as a finite element method with respect to the shape of the target antenna acquired by the characteristic value acquisition unit 13 to acquire the target characteristic value, it is possible for the designer to omit the process for acquiring the characteristic value of the target antenna.

The characteristic value determination unit 14 determines whether the target characteristic value of the target antenna acquired by the characteristic value acquisition unit 13 satisfies the characteristic included in the specification acquired by the specification acquisition unit 11. For example, the characteristic value determination unit 14 calculates a specific band from the target characteristic value of the target antenna to determine whether the calculated specific band satisfies a demanded specific band demanded by the specification.

The structure parameter generation unit 15 decides the value of the structure parameter regulating the structure of the target antenna such that the characteristic of the target antenna satisfies the demanded specification. The structure parameter includes the bending length of the target antenna, the thickness and the permittivity of a dielectric arranged in proximity, or the size of a ground electrode to be connected, for example. As the value of the structure parameter, at least one of the above-described items may be decided. The bending length of the target antenna is the length of a radiating electrode from an end part of a reversed L antenna or a reversed F antenna not having a bending part for extending the radiating electrode to an end part of the radiating electrode added by bending for extending. The structure parameter is stored in the memory circuit 4. The structure parameter generation unit 15 includes a demanded characteristic acquisition unit 31, a target antenna data acquisition unit 32, a target antenna characteristic estimation unit 33, a structure parameter decision unit 34, and a structure parameter output unit 35. The demanded characteristic acquisition unit 31 acquires a demanded characteristic being the characteristic demanded for the target antenna from the specification acquired by the specification acquisition unit 11. The target antenna data acquisition unit 32 acquires the value of the structure parameter of the target antenna and the target characteristic value corresponding to the value of the structure parameter.

Based on the value of the structure parameter, the target characteristic value at the time when the value of the structure parameter is a predetermined value, and the relation between the structure parameter and the characteristic with respect to the reference antenna indicated in the reference antenna table, the target antenna characteristic estimation unit 33 estimates the relation between the structure parameter and the characteristic with respect to the target antenna. The reference antenna in an example is a single or a plurality of reversed F antennas the type of which is the same as or different from the type of the target antenna. The target antenna characteristic estimation unit 33 refers to the reference antenna table indicating the relation between the structure parameter and the characteristic with respect to the reference antenna to estimate the relation between the structure parameter and the characteristic with respect to the target antenna.

FIG. 4A is a diagram illustrating an example of a reference antenna table. FIG. 4B is a diagram illustrating a first reference antenna used for creating the reference antenna table illustrated in FIG. 4A. FIG. 4C is a diagram illustrating a second reference antenna used for creating the reference antenna table illustrated in FIG. 4A. FIG. 4D is a diagram illustrating a third reference antenna used for creating the reference antenna table illustrated in FIG. 4A. FIG. 4E is a diagram illustrating a fourth reference antenna used for creating the reference antenna table illustrated in FIG. 4A. In each of FIGS. 4A to 4E, a reversed F antenna a ground electrode of which has longitudinal and transversal lengths of λ/4, for example, is illustrated and an element extending in a direction different from a first direction is connected to the ground electrode. FIG. 4F is a diagram illustrating relations between bending lengths and specific bands of antennas created from bending lengths and specific bands of the reference antennas illustrated in FIGS. 4B to 4E. In FIG. 4F, the horizontal axis indicates bending lengths and the vertical axis indicates specific bands.

The reference antenna table 400 indicates the relation between a bending length L of the radiating electrode of the reference antenna and a specific band BW of the reference antenna. When the bending length of the radiating electrode of the reference antenna is $L_1$, the specific band of the reference antenna is $BW_1$. When the bending length of the radiating electrode of the reference antenna is $L_2$, the specific band of the reference antenna is $BW_2$. Similarly, when the bending length of the radiating electrode of the reference antenna is $L_n$, the specific band of the reference antenna is $BW_n$. The reference antenna table 400 is stored in the storage device 5 in advance before performing antenna designing processing by the antenna designing device 1.

The length of each of the radiating electrodes 416 to 419 of a first reference antenna 411 to a fourth reference antenna 414 which are reversed F antennas is extended by bending at a predetermined position so that the antenna is contained in a predetermine arrangement region 410. The radiating electrode 416 of the first reference antenna 411 has a shape that extends in a first direction and bends at a right angle at a first bending part A1 to further extend in a second direction. The radiating electrode 417 of the second reference antenna 412 has a shape that bends at a right angle at a second bending part A2 positioned at an end part of the electrode of the radiating electrode 416 of the first reference antenna 411 to further extend in the direction opposite to the first direction. The radiating electrode 418 of the third reference antenna 413 has a shape that bends at a right angle at a third bending part A3 positioned at an end part of the electrode of the radiating electrode 417 of the second reference antenna 412 to further extend in the direction opposite to the second direction. The radiating electrode 419 of the fourth reference antenna 414 has a shape that bends at a right angle at a fourth bending part A4 positioned at an end part of the electrode of the radiating electrode 418 of the third reference antenna 413 to further extend in the first direction. The bending length from the first bending part A1 to the second bending part A2 is LA1, and the bending length from the first bending part A1 to the third bending part A3 is LA2. The bending length from the first bending part A1 to the fourth bending part A4 is LA3, and the bending length from the first bending part A1 to an end part A5 is LA4. The specific band BW of each of first reference antenna 411, the second reference antenna 412, the third reference antenna 413, and the fourth reference antenna 414 is measured by electromagnetic field simulation or actual measurement.

A curve 420 illustrated in FIG. 4F is generated by plotting points indicating relations between the bending length L and the specific band BW of each of the first reference antenna 411, the second reference antenna 412, the third reference antenna 413, and the fourth reference antenna 414 and interpolating between the plotted points by interpolation. The third reference antenna 413 and the fourth reference antenna 414 are standardized by wavelength. An arrow A indicates a point corresponding to the first reference antenna 411. An arrow B indicates a point corresponding to the second reference antenna 412. An arrow C indicates a point corresponding to the third reference antenna 413. An arrow D indicates a point corresponding to the fourth reference antenna 414. The curve 420 illustrates relations between the bending lengths L being the structure parameters of the reference antennas 411 to 414 with respect to the reference antennas and the specific bands BW being the reference characteristic values being the characteristic values.

The reference antenna table 400 is created by using the curve 420 illustrated in FIG. 4F and an approximate expression with which interpolation has been performed between each of the plots of the first reference antenna 411, the second reference antenna 412, the third reference antenna 413, and the fourth reference antenna 414.

Based on the structure parameter, the target characteristic value at the time when the structure parameter is a predetermined value, and the relation between the structure parameter and the characteristic with respect to the reference antenna indicated in the reference antenna table 400, the target antenna characteristic estimation unit 33 estimates the relation between the structure parameter and the characteristic with respect to the target antenna.

Figure 5A:
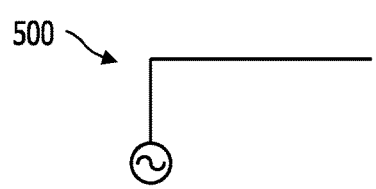
FIG. 5A is a diagram illustrating a reversed L antenna being an example of a target antenna.
Figure 5B:
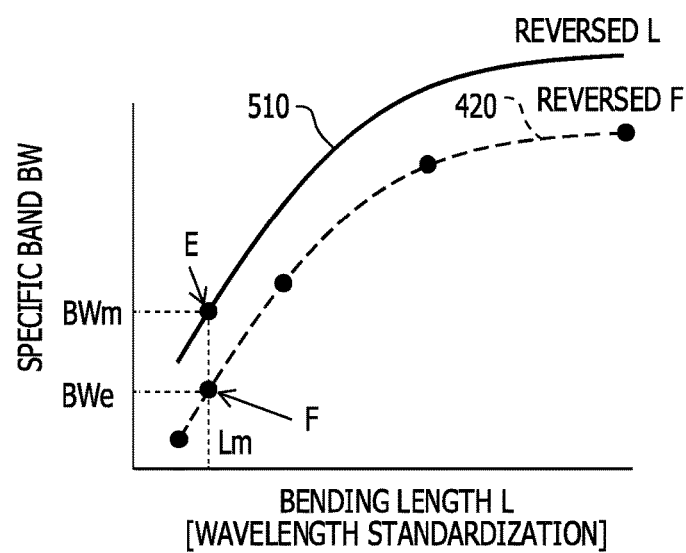
FIG. 5B is a diagram illustrating the estimation processing performed by the target antenna characteristic estimation unit.

With reference to FIGS. 5A and 5B, examples of estimation processing performed by the target antenna characteristic estimation unit 33 will be explained. FIG. 5A is a diagram illustrating a reversed L antenna being an example of a target antenna. FIG. 5B is a diagram illustrating the estimation processing performed by the target antenna characteristic estimation unit 33. In FIG. 5B, the horizontal axis indicates bending lengths standardized by wavelength and the vertical axis indicates specific bands.

The target antenna characteristic estimation unit 33 generates a curve 510 based on the relation between the bending length L of the target antenna 500 measured by electromagnetic field simulation or actual measurement and the specific band BW at the time when the value of the structure parameter is a predetermined value and the curve 420 illustrated in FIG. 4F. In an example, the curve 510 is generated by shifting the curve 420 using a ratio between a measured specific band BWm of the target antenna 500 indicated by an arrow E and a specific band BWe of the reference antenna in a bending length Lm of the target antenna 500. When the curve 420 of the reference antenna is present in plurality, the curve 510 is created by Lagrange interpolation or the like. The curve 510 indicates the relation between the bending length L being an example of the structure parameter with respect to the target antenna and the specific band BW being an example of the target characteristic value.

The structure parameter decision unit 34 decides the value of the structure parameter such that the characteristic of the target antenna satisfies the demanded specification. The structure parameter decision unit 34 decides the value of the structure parameter based on the relation between the structure parameter and the characteristic with respect to the target antenna which has been estimated by the target antenna characteristic estimation unit 33.

Figure 6:
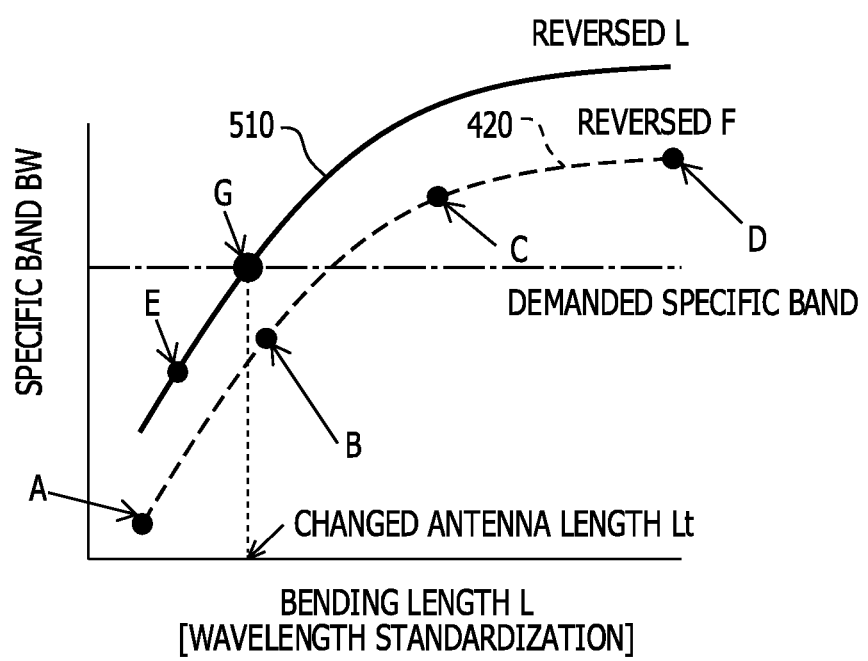
FIG. 6 is a diagram explaining an example of structure parameter decision processing performed by a structure parameter decision unit illustrated in FIG. 2.

With reference to FIG. 6, an example of structure parameter decision processing performed by the structure parameter decision unit 34 will be explained. In the example explained with reference to FIG. 6, the structure parameter is the bending length L and the characteristic value is the specific band BW. FIG. 6 is a diagram illustrating the structure parameter decision processing performed by the structure parameter decision unit 34. The horizontal axis indicates bending lengths standardized by wavelength and the vertical axis indicates specific bands.

Based on the curve 510 indicating the relation between the bending length L of the target antenna 500 and the specific band BW of the target antenna 500 which has been estimated by the target antenna characteristic estimation unit 33, the structure parameter decision unit 34 decides the bending length L with which the characteristic of the target antenna satisfies the demanded specification. In an example, the structure parameter decision unit 34 decides a bending length Lt with which the specific band BW corresponds to the demanded specific band illustrated with the alternate long and short dash line in FIG. 6 to be the bending length with which the characteristic of the target antenna satisfies the demanded specification.

The structure parameter output unit 35 outputs the value of the structure parameter decided by the structure parameter decision unit 34.

The target antenna shape decision unit 16 decides the shape of the target antenna regulated by the structure parameter. The target antenna shape decision unit 16 refers to the target antenna shape table when deciding the shape of the target antenna.

With reference to FIGS. 7A to 7C, examples of target antenna shape decision processing performed by the target antenna shape decision unit 16 will be explained. In the examples explained with reference to FIGS. 7A to 7C, the structure parameter is the bending length L and the target antenna is a reversed L antenna. Furthermore, in the examples explained with reference to FIGS. 7A to 7C, the size of the arrangement region of the target antenna is the same as that of the reference antenna. FIG. 7A is a diagram illustrating an example of the target antenna table. FIG. 7B is a diagram illustrating the target antenna shape decision processing using the target antenna table illustrated in FIG. 7A. FIG. 7C is a diagram illustrating an example of a target antenna decided by the target antenna shape decision processing. In each of FIGS. 7B and 7C, although a feeding point is provided between a ground electrode and an antenna element, illustration of the ground electrode is omitted.

A target antenna table 700 regulates the relation between the bending length L of the radiating electrode of the target antenna and the extending direction of the radiating electrode. The target antenna table 700 is stored in the storage device 5 in advance before the antenna designing processing by the antenna designing device 1 is performed. Each of LA1 to LA4 indicated in the target antenna table 700 is the bending length L from the first bending part A1 to the fourth bending part A4 explained with reference to FIGS. 4A to 4F. When the bending length L of the reference antennas 411 to 414 is less than LA1, the radiation conductor extends in the first direction. When the bending length L of the reference antennas 411 to 414 is equal to or longer than the bending length LA1 and less than LA2, the radiation conductor extends in the first direction, and after that, further extends in the second direction perpendicular to the first direction. When the bending length L of the reference antennas 411 to 414 is equal to or longer than the bending length LA2 and less than LA3, the radiation conductor extends in the first direction and in the second direction in order, and after that, further extends in the direction opposite to the first direction. When the bending length L of the reference antennas 411 to 414 is equal to or longer than the bending length LA3 and less than LA4, the radiation conductor extends in the first direction, in the second direction, and in the direction opposite to the first direction in order, and after that, further extends in the direction opposite to the second direction. When the bending length L of the reference antennas 411 to 414 is equal to or longer than the bending length LA4, the radiation conductor extends in the first direction, in the second direction, in the direction opposite to the first direction, and in the direction opposite to the second direction in order, and after that, further extends in the first direction.

When the bending length L is less than LA1, a radiation conductor 711 of the target antenna 710 extends in the first direction. When the bending length L is equal to or longer than LA1 and less than LA2, the radiation conductor 711 of the target antenna 710 bends at a right angle at the first bending part A1 positioned in the bending length LA1 and further extends in the second direction. When the bending length L is equal to or longer than LA2 and less than LA3, the radiation conductor 711 of the target antenna 710 bends at a right angle at the second bending part A2 positioned in the bending length LA2 and further extends in the direction opposite to the first direction. When the bending length L is equal to or longer than LA3 and less than LA4, the radiation conductor 711 of the target antenna 710 bends at a right angle at the third bending part A3 positioned in the bending length LA3 and further extends in the direction opposite to the second direction. Furthermore, when the bending length L is equal to or longer than LA4, the radiation conductor 711 of the target antenna 710 bends at a right angle at the fourth bending part A4 positioned in the bending length LA4 and further extends in the first direction.

The bending length L of the target antenna 720 is the bending length Lt decided by the structure parameter decision processing explained with reference to FIG. 6. The bending length Lt of the target antenna 720 is slightly shorter than the bending length LA2 of the second reference antenna 412 indicated with the arrow B in FIG. 6, and the shape of the target antenna 710 is thus decided such that the bending length L is slightly shorter than the bending length LA2 of the second reference antenna 412.

Figure 8:
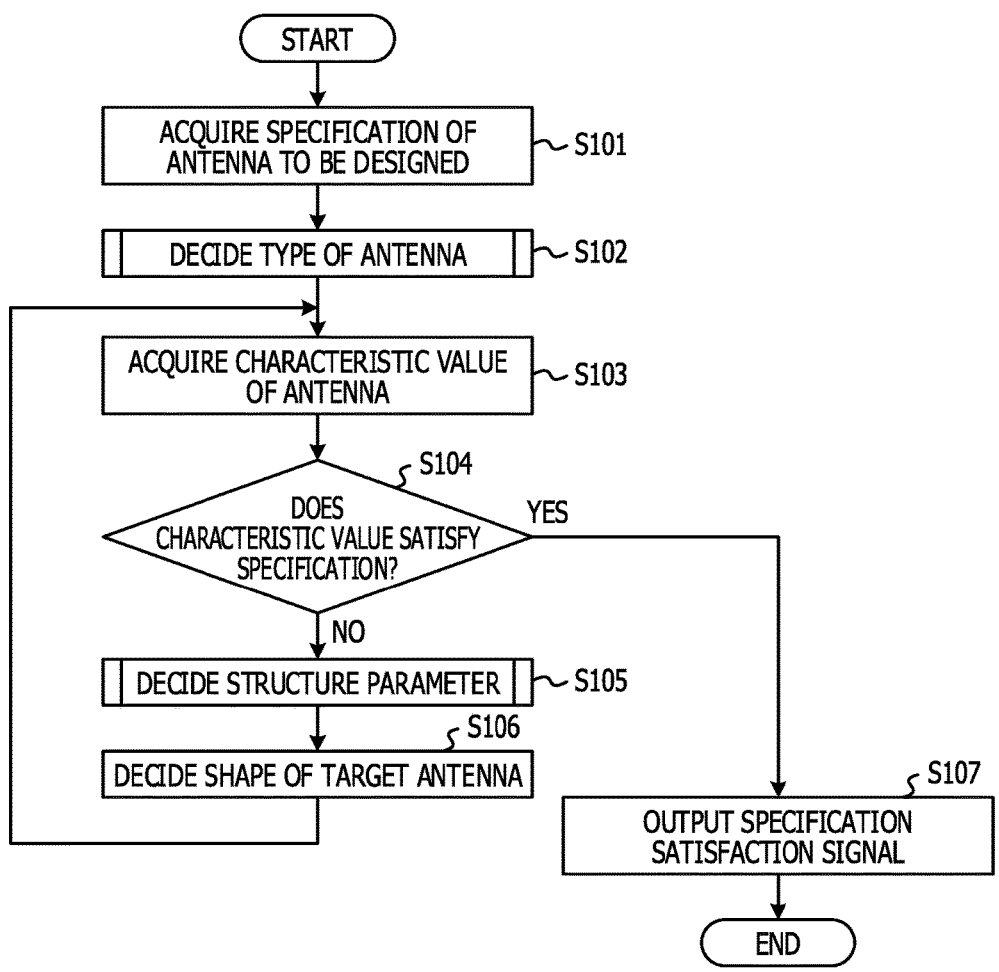
FIG. 8 is a flowchart of antenna designing processing performed by the antenna designing device illustrated in FIG. 1.

FIG. 8 is a flowchart of antenna designing processing performed by the antenna designing device 1. The antenna designing processing is performed by the processing unit 7 in cooperation with each element of the antenna designing device 1 based on a program stored in the memory circuit 4 in advance.

Firstly, the specification acquisition unit 11 acquires the specification demanded for the antenna to be designed (S101). Next, the antenna type decision unit 12 refers to the antenna type decision table stored in the storage device 5 to decide the type of the target antenna from the specification acquired by the specification acquisition unit 11, and outputs the decided type of the target antenna (S102). Next, the characteristic value acquisition unit 13 acquires the target characteristic value being the characteristic value of the target antenna the shape of which has been decided at S102 (S103). Next, the characteristic value determination unit 14 determines whether the target characteristic value acquired by the characteristic value acquisition unit 13 at S103 satisfies the specification acquired by the specification acquisition unit 11 at S101 (S104). When it is determined that the target characteristic value does not satisfy the specification (No at S104), the structure parameter generation unit 15 decides the value of the structure parameter regulating the structure of the target antenna such that the characteristic of the target antenna satisfies the demanded specification (S105). Next, the target antenna shape decision unit 16 decides the shape of the target antenna regulated by the structure parameter decided by the structure parameter generation unit 15 (S106). The processing unit 7 performs the processing at and after S103. By contrast, when it is determined that the target characteristic value satisfies the specification (Yes at S104), the specification satisfaction signal output unit 17 outputs a specification satisfaction signal (S107) to end the processing.

Figure 9:
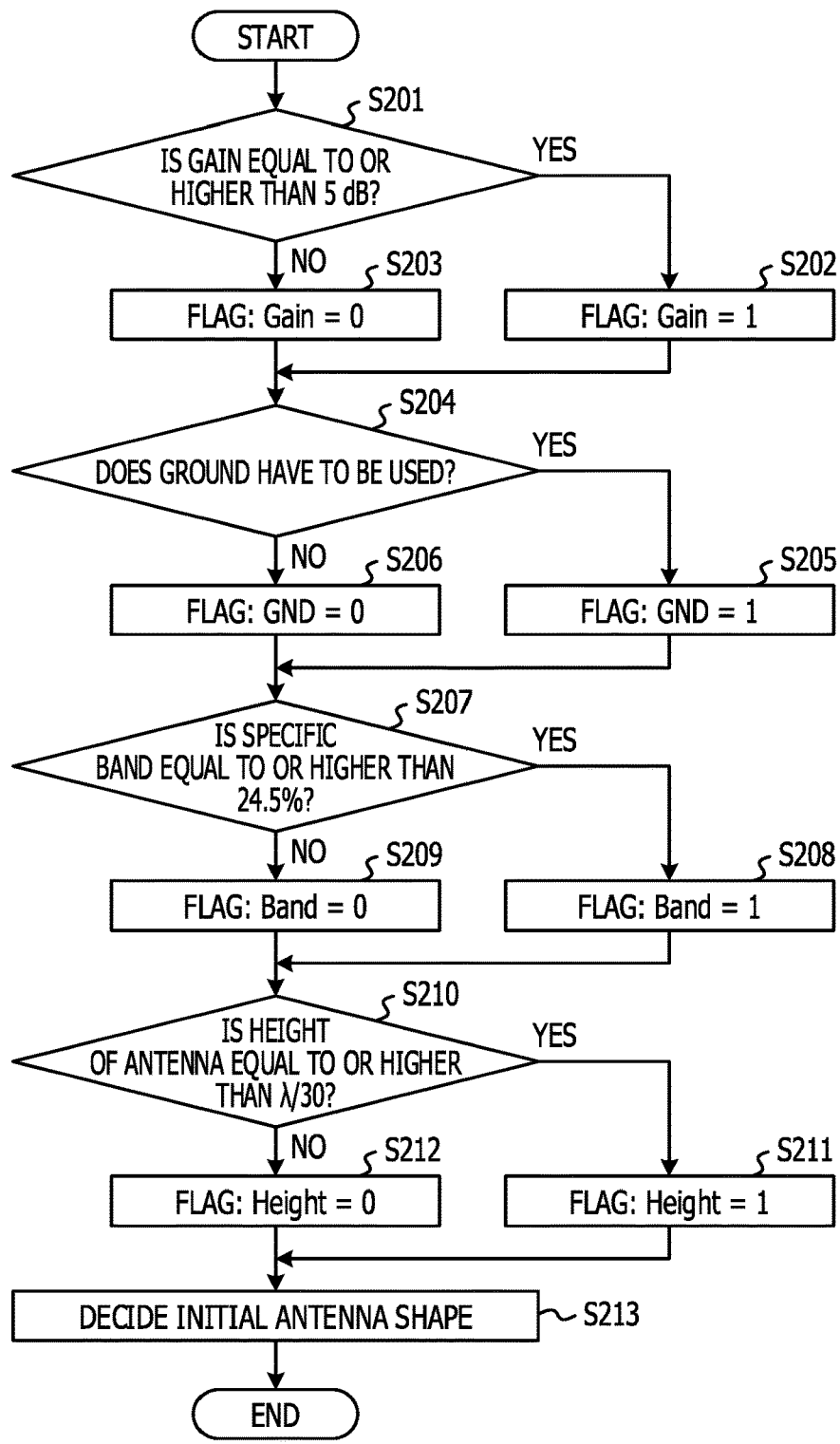
FIG. 9 is a flowchart illustrating in more details processing at S102 illustrated in FIG. 8.

FIG. 9 is a flowchart illustrating in more details processing at S102.

Firstly, the specification determination unit 21 determines whether a gain included in the specification acquired at S101 is equal to or higher than 5 dB (S201). When determining that the gain is equal to or higher than 5 dB, the specification determination unit 21 sets the flag "Gain" of the determination result information stored in the memory circuit 4 to 1 (S202). Furthermore, when determining that the gain is lower than 5 dB, the specification determination unit 21 sets the flag "Gain" of the determination result information stored in the memory circuit 4 to 0 (S203).

Next, the specification determination unit 21 determines whether the information indicating that a ground electrode has to be used is included in the specification acquired at S101 (S204). When determining that the information indicating that a ground electrode has to be used is included, the specification determination unit 21 sets the flag "GND" of the determination result information stored in the memory circuit 4 to 1 (S205). Furthermore, when determining that the information indicating that a ground electrode has to be used is not included, the specification determination unit 21 sets the flag "GND" of the determination result information stored in the memory circuit 4 to 0 (S206).

Next, the specification determination unit 21 determines whether the specific band included in the specification acquired at S101 is equal to or higher than 24.5% (S207). When determining that the specific band is equal to or higher than 24.5%, the specification determination unit 21 sets the flag "Band" of the determination result information stored in the memory circuit 4 to 1 (S208). Furthermore, when determining that the specific band is lower than 24.5%, the specification determination unit 21 sets the flag "Band" of the determination result information stored in the memory circuit 4 to 0 (S209).

Next, the specification determination unit 21 determines whether the height of the antenna included in the specification acquired at S101 is equal to or higher than $\lambda/30$ (S210). When determining that the height of the antenna is equal to or higher than $\lambda/30$, the specification determination unit 21 sets the flag "Height" of the determination result information stored in the memory circuit 4 to 1 (S211). Furthermore, when determining that the height of the antenna is lower than $\lambda/30$, the specification determination unit 21 sets the flag "Height" of the determination result information stored in the memory circuit 4 to 0 (S212).

The antenna type determination unit 22 refers to the antenna type decision table to decide the type of the antenna from the determination result information stored in the memory circuit 4 (S213) to end the processing.

Figure 10:
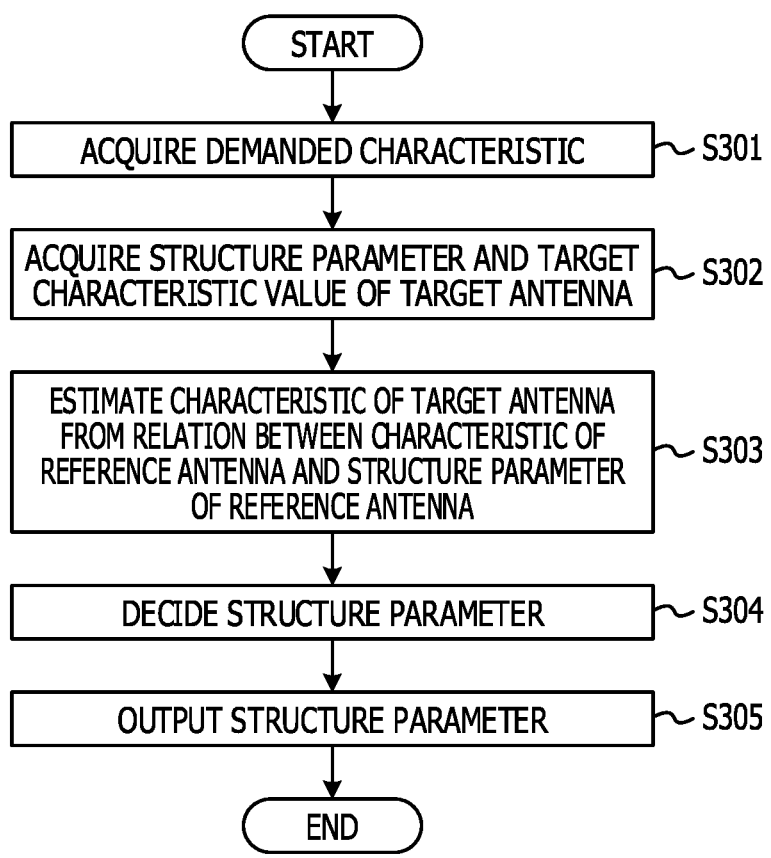
FIG. 10 is a flowchart illustrating in more details processing at S105 illustrated in FIG. 8.

FIG. 10 is a flowchart illustrating in more details processing at S105.

Firstly, the demanded characteristic acquisition unit 31 acquires a demanded characteristic being the characteristic demanded for the target antenna whose target characteristic value has been determined at S104 as not satisfying the specification (S301). Next, the target antenna data acquisition unit 32 acquires the value of the structure parameter of the target antenna and the target characteristic value corresponding to the value of the structure parameter (S302). Next, based on the structure parameter, the target characteristic value at the time when the value of the structure parameter is a predetermined value, and the relation between the structure parameter and the characteristic with respect to the reference antenna indicated in the reference antenna table 400, the target antenna characteristic estimation unit 33 estimates the relation between the structure parameter and the characteristic with respect to the target antenna (S303). Next, the structure parameter decision unit 34 decides the value of the structure parameter such that the characteristic of the target antenna to be estimated satisfies the demanded specification (S304). Furthermore, the structure parameter output unit 35 outputs the value of the structure parameter decided at S304 (S305) to end the processing.

The antenna designing device according to the embodiment is able to decide the shapes of different types of antennas from the same information by estimating the characteristic at the time of causing the shape of the target antenna to be the same shape as that of the reference antenna and identifying the structure parameter at the time when the target antenna has the desired characteristic. Furthermore, the antenna designing device according to the embodiment estimates the relation between the structure parameter and the characteristic with respect to different types of target antennas from the relation between the structure parameter and the characteristic with respect to the reference antenna. For this reason, the relation between the structure parameter and the characteristic for each type of target antennas does not have to be stored. The antenna designing device according to the embodiment does not have to store therein the relation between the structure parameter and the characteristic for each type of target antennas, thereby enabling simplification of the database.

In the antenna designing device 1, the specification determination unit 21 determines the specification by deciding the processing from S201 to S212. However, in the antenna designing device according to the embodiment, the specification may be determined based on a specification and a threshold other than the specification and the threshold indicated at S201 to S212.

Furthermore, in the antenna designing device according to the embodiment, the structure parameter of the antenna may be changed in accordance with a change in the characteristic of the antenna such as a change in the width of the antenna, arrangement of a metal, a dielectric, or a magnetic body in proximity, and a change in the substrate material. Although the specific band has been described as an example of the characteristic of the antenna, the characteristic of the antenna may be an S parameter, a radiation efficiency, or a gain.

Figure 11B:
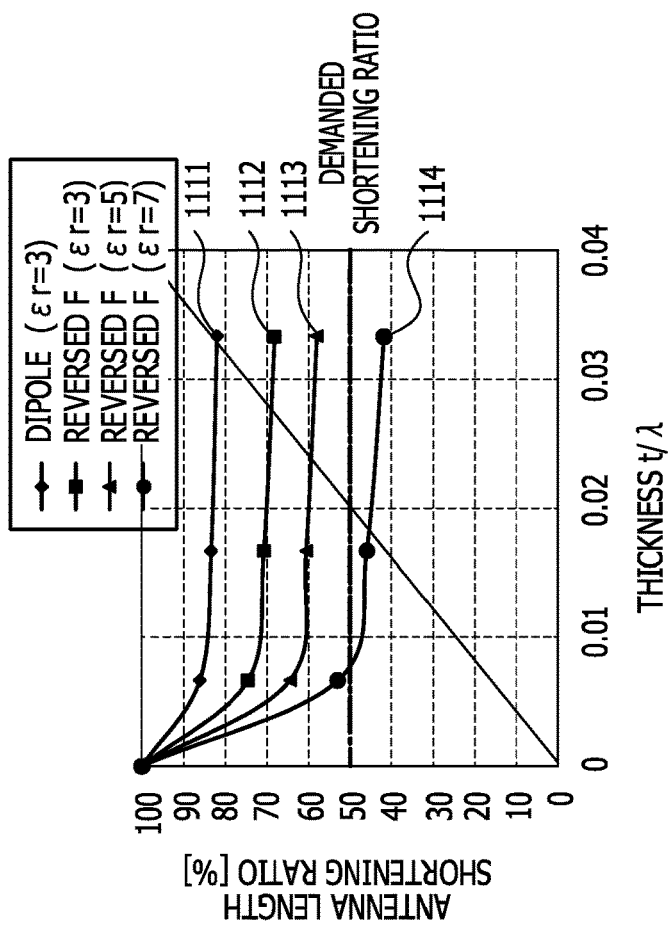
FIG. 11B is a diagram illustrating relations between shortening ratios of antenna lengths of reference antennas and characteristic of dielectrics arranged in proximity to the reference antennas.
Figure 11A:
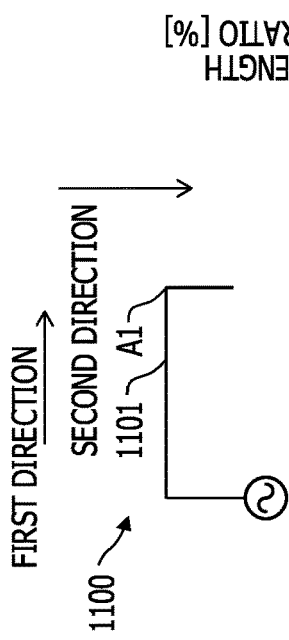
FIG. 11A is a diagram illustrating another example of a target antenna.
Figure 11C:
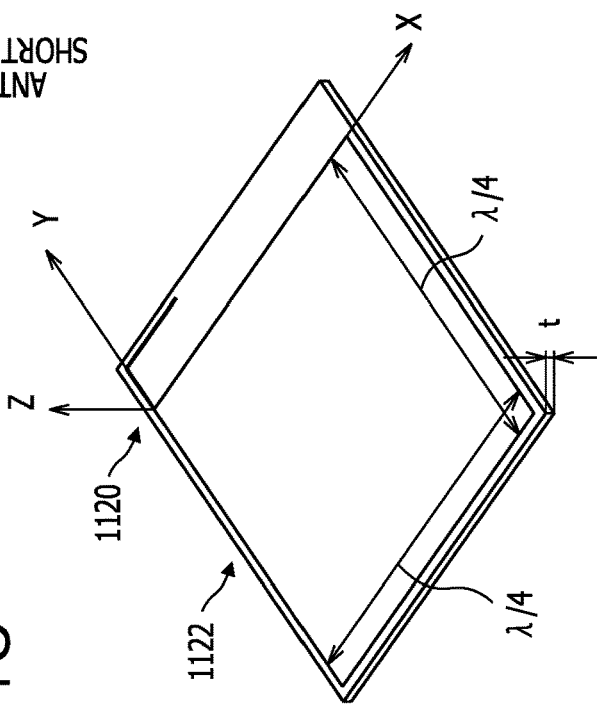
FIG. 11C is a diagram illustrating another example of a target antenna decided by the target antenna shape decision processing.

With reference to FIGS. 11A to 11C, examples will be explained in which the structure parameter includes the thickness and the permittivity of a dielectric arranged in proximity to the target antenna and the characteristic value is the S parameter. FIG. 11A is a diagram illustrating a target antenna. FIG. 11B is a diagram illustrating relations between shortening ratios of antenna lengths of reference antennas and thicknesses and relative permittivities of dielectrics arranged in proximity to the reference antennas. FIG. 11C is a diagram illustrating a target antenna the shape of which has been changed. In FIG. 11B, the horizontal axis indicates the thickness of the dielectric (standardized by wavelength) arranged in proximity to a reversed F antenna or a dipole antenna being a reference antenna and the vertical axis indicates the shortening ratio of the antenna length of the reference antenna. In FIG. 11B, a curve 1111 interpolating between rhombic marks represents a case where the reference antenna is a dipole antenna and the relative permittivity is 3. A curve 1112 interpolating between square marks represents a case where the reference antenna is a reversed F antenna and the relative permittivity is 3. A curve 1113 interpolating between triangle marks represents a case where the reference antenna is a reversed F antenna and the relative permittivity is 5. A curve 1114 interpolating between circle marks represents a case where the reference antenna is a reversed F antenna and the relative permittivity is 7. Furthermore, in FIG. 11B, the alternate long and short dash line represents a demanded shortening ratio regulated by the S parameter.

A radiating electrode 1101 of a target antenna 1100 has a shape that extends in the first direction, bends at a right angle at the first bending part A1, and further extends in the second direction. The target antenna 1100 may be the target antenna 720 having the shape decided by the processing explained with reference to FIGS. 7A to 7C.

Based on the relation between the thickness and the permittivity of a substrate and the demanded shortening ratio regulated by the S parameter illustrated in FIG. 11B, the target antenna characteristic estimation unit 33 estimates the relation between the shortening ratio of the antenna length being the structure parameter and the demanded shortening ratio regulated by the S parameter being the characteristic value. The shape of the target antenna 1100 is a reversed L antenna and the shape of the reference antennas is a reversed F antenna or a dipole antenna. The type of the target antenna 1100 is thus different from the types of the reference antennas. The target antenna characteristic estimation unit 33 estimates the demanded shortening ratio at the time when a dielectric of a reference antenna having a different type is arranged in proximity to be the demanded shortening ratio at the time when the dielectric of the target antenna 1100 is arranged in proximity.

Based on the relation between the thickness and the permittivity of the substrate and the demanded shortening ratio which has been estimated by the target antenna characteristic estimation unit 33, the structure parameter decision unit 34 decides the shape of the target antenna 1120. When the demanded shortening ratio regulated by the S parameter is 50%, the structure parameter decision unit 34 decides the thickness and the relative permittivity of the substrate with which the stretching ratio of the antenna length of the target antenna 1120 being the structure parameter is 50%. In addition, the structure parameter decision unit 34 decides that a substrate 1122 of which the dielectric thickness t of target antenna 1120 being the characteristic value is 0.008λ and the relative permittivity εr is 7 is arranged in proximity to the target antenna 1120.

With reference to FIGS. 12A to 12C, examples in which the structure parameter is the size of the ground electrode connected to the antenna and the characteristic value is the S parameter will be explained. FIG. 12A is a diagram illustrating a target antenna. FIG. 12B is a diagram illustrating relations between sizes of ground electrodes of the reference antennas and shortening ratios of antenna lengths of reference antennas. FIG. 12C is a diagram illustrating a target antenna the shape of which has been changed. In FIG. 12B, the horizontal axis indicates the length (standardized by wavelength) in the Y direction of the ground electrode of a dipole antenna being a reference antenna and the vertical axis indicates the shortening ratio of the antenna length of the reference antenna. In FIG. 12B, a curve 1211 interpolating between rhombic marks represents a case where the length in the X direction of the ground electrode of the reference antenna is λ/15. A curve 1212 interpolating between triangle marks represents a case where the length in the X direction of the ground electrode is λ/7.5. A curve 1213 interpolating between square marks represents a case where the length in the X direction of the ground electrode of the reference antenna is λ/5. A curve 1214 interpolating between x marks represents a case where the length in the X direction of the ground electrode of the reference antenna is λ/4. Furthermore, in FIG. 12B, the alternate long and short dash line represents a demanded shortening ratio regulated by the S parameter.

A radiating electrode 1201 of a target antenna 1200 has a shape that extends in the first direction, bends at a right angle at the first bending part A1, and further extends in the second direction. The target antenna 1200 may be the target antenna 720 having the shape decided by the processing explained with reference to FIGS. 7A to 7C. The length in the X direction of a ground electrode 1202 to which the target antenna 1200 is connected is λ/15, and the length in the Y direction is 0.1λ. The shortening ratio of the antenna length of the target antenna 1200 is 140%.

Based on the relation between the size of the ground electrode with respect to the reference antenna and the demanded shortening ratio regulated by the S parameter illustrated in FIG. 12B, the target antenna characteristic estimation unit 33 estimates the relation between the size of the ground electrode with respect to the target antenna and the demanded shortening ratio regulated by the S parameter. The type of the target antenna 1200 is a reversed L antenna and the type of the reference antenna is a vertical monopole antenna the ground electrode of which has a finite size. The type of the target antenna 1200 is thus different from the type of the reference antenna. The target antenna characteristic estimation unit 33 estimates the demanded shortening ratio at the time when the size of the ground electrode of the reference antenna having a different type has been changed to be the demanded shortening ratio at the time when the size of the ground electrode of the target antenna 1200 has been changed.

Based on the relation between the size of the ground electrode and the demanded shortening ratio which has been estimated by the target antenna characteristic estimation unit 33, the structure parameter decision unit 34 decides the shape of a target antenna 1220. When the demanded compression rate regulated by the S parameter is 100% and the shortening ratio of the antenna length of the target antenna 1200 is changed from 140% to 100%, the structure parameter decision unit 34 decides that the antenna length of the target antenna 1200 is set to 71% of the length of the target antenna 1200. In addition, the structure parameter decision unit 34 decides that the length in the X direction of a ground electrode 1222 of the target antenna 1220 is not changed from λ/15 and the length in Y direction is changed from 0.1λ to 0.23λ.

Furthermore, in the examples explained with reference to FIGS. 7A to 7C, the size of the arrangement region of the target antenna is the same as the size of the arrangement region of the reference antenna. However, in the antenna designing device according to the embodiment, the size of the arrangement region of the target antenna may be different from the size of the arrangement region of the reference antenna. When the size of the arrangement region of the target antenna is different from the size of the arrangement region of the reference antenna, the bending length of the target antenna is decided in accordance with the size of the arrangement region of the target antenna. When the target antenna is a reversed L antenna extending in the long side direction of the arrangement region thereof, the radiating electrode at the time when the bending length is added extends to an appropriate position within the arrangement region in parallel to the short side direction of the arrangement region. When the length of the radiating electrode is further extended, the radiating electrode extends to another position within the arrangement region in the direction parallel to and opposite to the extending direction of the reversed L antenna in the arrangement region. The target antenna table regulates the bending length extendable within the arrangement region.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A non-transitory computer-readable storage medium storing an antenna design program that causes a computer to execute a process, the process comprising:
   acquiring a demanded specification information of a target antenna;
   determining a target antenna type of the target antenna based on the acquired specification information;
   estimating a target relation between a characteristic value in the target antenna type and a value of a structure parameter in the target antenna by interpolating the characteristic value in the target antenna type when the value of the structure parameter is a predetermined value, the interpolating being based on a reference relation between a value of the structure parameter in a reference antenna and a characteristic value in a reference antenna type of the reference antenna, the structure parameter being a parameter that regulates a structure of the target antenna and the reference antenna respectively, the reference antenna having a same shape feature as the target antenna, the reference antenna type being different from the target antenna type;
   determining a value of the structure parameter for the target antenna such that the characteristic value of the target antenna satisfies the demanded specification based on the estimated target relation; and
   outputting the determined value of the structure parameter, the determined value of the structure parameter regulating at least one of bending, extending, and shortening of an antenna element of the target antenna in a specified direction based on the estimated target relation, resulting in a final antenna design.

2. The non-transitory computer-readable storage medium according to claim 1,
   wherein the structure parameter includes at least one of a bending length of the target antenna, a thickness and a permittivity of a dielectric that is arranged in proximity to the target antenna, and a size of a ground electrode that is coupled to the target antenna.

3. The non-transitory computer-readable storage medium according to claim 1,
   wherein the characteristic value includes at least one of a specific band, a gain, a radiation efficiency, and an scattering parameter.

4. The non-transitory computer-readable storage medium according to claim 1, wherein the process comprises:
   acquiring the characteristic value of the target antenna that has a shape corresponding to a specified structure parameter;
   determining whether the acquired characteristic value corresponding to the specified structure parameter satisfies the demanded specification or not;
   outputting information indicating that the demanded specification is satisfied when it is determined that the acquired characteristic value satisfies the demanded specification; and
   executing again the determining a value of the structure parameter when it is determined that the acquired characteristic value does not satisfy a demanded specification.

5. The non-transitory computer-readable storage medium according to claim 1,
   wherein the process comprises: determining the target antenna type of the target antenna based on the acquired specification information and antenna type information indicating a plurality of specifications corresponding to each of a plurality of antenna type, respectively.

6. An antenna design device comprising:
   a memory configured to store a reference relation between a value of a structure parameter in a reference antenna and a characteristic value in a reference antenna type of the reference antenna; and
   a processor coupled to the memory and the processor configured to:
   acquire a demanded specification information of a target antenna;
   determine a target antenna type of the target antenna based on the acquired specification information;
   estimate a target relation between a characteristic value in the target antenna type and a value of a structure parameter in the target antenna by interpolating the characteristic value in the target antenna type when the value of the structure parameter is a predetermined value, the interpolating being based on the stored reference relation, the structure parameter being a parameter that regulates a structure of the target antenna and the reference antenna respectively, the reference antenna having a same shape feature as the target antenna, the reference antenna type being different from the target antenna type;
   determine a value of the structure parameter for the target antenna such that the characteristic value of the target antenna satisfies a demanded specification based on the estimated target relation; and output the determined value of the structure parameter, the determined value of the structure parameter regulating at least one of bending, extending, and shortening of an antenna element of the target antenna in a specified direction based on the estimated target relation, resulting in a final antenna design.

7. An antenna design method comprising:

acquiring a demanded specification information of a target antenna;

determining a target antenna type of the target antenna based on the acquired specification information;

estimating a target relation between a characteristic value in the target antenna type and a value of a structure parameter in the target antenna by interpolating the characteristic value in the target antenna type when the value of the structure parameter is a predetermined value, the interpolating being based on a reference relation between a value of the structure parameter in a reference antenna and a characteristic value in a reference antenna type of the reference antenna, the structure parameter being a parameter that regulates a structure of the target antenna and the reference antenna respectively, the reference antenna having a same shape feature as the target antenna, the reference antenna type being different from the target antenna type;

determining a value of the structure parameter for the target antenna such that the characteristic value of the target antenna satisfies a demanded specification based on the estimated target relation; and outputting the determined value of the structure parameter, the determined value of the structure parameter regulating at least one of bending, extending, and shortening of an antenna element of the target antenna in a specified direction based on the estimated target relation, resulting in a final antenna design.

* * * * *